United States Patent
Cai et al.

(10) Patent No.: US 7,125,777 B2
(45) Date of Patent: Oct. 24, 2006

(54) ASYMMETRIC HETERO-DOPED HIGH-VOLTAGE MOSFET (AH²MOS)

(75) Inventors: Jun Cai, Scarborough, ME (US); Michael Harley-Stead, Portland, ME (US); Jim G. Holt, Los Altos, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 40 days.

(21) Appl. No.: 10/893,519

(22) Filed: Jul. 15, 2004

(65) Prior Publication Data

US 2006/0011985 A1    Jan. 19, 2006

(51) Int. Cl.
*H01L 21/8249* (2006.01)

(52) U.S. Cl. .................. 438/286; 438/531; 257/E21.417

(58) Field of Classification Search .............. 438/186, 438/194–197, 286, 289–291, 306, 514, 527, 438/531; 257/E21.417
See application file for complete search history.

(56) References Cited

U.S. PATENT DOCUMENTS

| | | | |
|---|---|---|---|
| 5,264,719 A | * | 11/1993 | Beasom .................. 257/335 |
| 5,304,827 A | * | 4/1994 | Malhi et al. ............. 257/262 |
| 6,127,696 A | | 10/2000 | Sery et al. |
| 6,240,267 B1 | | 5/2001 | Compera |
| 6,297,108 B1 | | 10/2001 | Chu |
| 6,372,586 B1 | | 4/2002 | Efland et al. |
| 6,734,496 B1 | * | 5/2004 | Fujihira .................. 257/339 |

* cited by examiner

*Primary Examiner*—Marcos D. Pizarro
(74) *Attorney, Agent, or Firm*—Thomas R. FitzGerald, Esq.; Hiscock & Barclay, LLP

(57) ABSTRACT

An asymmetric hetero-doped metal oxide (AH²MOS) semiconductor device includes a substrate and an insulated gate on the top of the substrate disposed between a source region and a drain region. On one side of the gate, heterodoped tub and source regions are formed. The tub region has dopants of a second polarity. A source region is disposed inside each tub region and has dopants of a first polarity opposite to the second polarity. On the other side of the gate, heterodoped buffer and drift regions are formed. The buffer regions comprise dopants of the second polarity. The drift regions are disposed inside the buffer regions and are doped with dopants of the first polarity. A drain n+ tap region is disposed in the drift region.

23 Claims, 8 Drawing Sheets

N- DRIFT AND p- BUFFER SHARE ONE MASK $AH^2$ MOS $AH^2$ MOS

ASYMMETRIC HETERO-DOPED HIGH-VOLTAGE MOSFET (AH²MOS)

BACKGROUND

This invention relates in general to lateral power transistors and in particular to a lateral Asymmetric Hetero-doped High-voltage MOSFET (AH²MOS) transistors for integrated circuits and for power semiconductor devices.

The operation and cost of an electronic system is improved by reducing the size of transistors and number of packaged devices that make up the system. Many electronic systems save space by forming devices of different types on the same substrate. For example, systems such as cell phones, personal digital assistants and mother boards of personal computers have used separately packaged parts for performing power supply and logic operation. To save space, manufacturers now try to reduce the size of the components in each package, use common process steps for power and logic devices and fabricate power and logic devices on a common semiconductor substrate.

The LDMOS device is a popular transistor for supplying power to electronic systems. It is characterized by a highly doped source disposed in a well or body region that is established by a double diffused implant. Over the source and well is an insulated gate. Spaced from the well is a drift region that holds a drain. The voltage on the gate controls current that flows laterally from the drain, through the drift region and into the source. The drift region is usually lightly doped, or at least less doped than either the source or drain.

Logic devices usually have very shallow source and drain regions. In contrast, LDMOS and other high voltage devices often have diffusion regions that extend deep by into the substrate. Such differences present obstacles to using common steps to form power on logic devices on the same substrate. As device features shrink laterally to submicron sizes, the LDMOS device must also scale its vertical dimensions. That presents a problem because many LDMOS and other power devices rely upon high temperatures and long duration diffusion times to establish deep diffusions that support high voltages. Such deep diffusion process steps are not compatible with smaller geometry, shallow junction logic devices. When high voltage devices are added a low voltage, shallow junction deep submicron logic process, the low voltage process limit all diffusion steps to lower temperatures and short cycle times. A conventional thermal diffusion for a power device would destroy the junctions in a deep-submicron CMOS process. One solution to this problem makes the LDMOS first, masks the LDMOS devices, and then makes the low voltage devices in accordance with their lower temperature requirements. However, this will limit LDMOS p-body self-align to gate poly. Therefore, LDMOS devices will have very long gate poly lengths and that feature induces large channel resistance and increases device size, despite using advanced process tools.

In order to solve this problem others have proposed forming power devices by using high dose implants that are made at large implant angles instead of conventional, small angle about ion implants and long thermal diffusions. While such high dose and high angle implants may support a long enough p-body channel for device punch-through, those processes add more steps to the manufacturing process and thus increase the cost of parts. In addition, such processes are often limited by their size of photoresist opening area. It is conventional to use photoresist as a mask to self-align a body implant to the gate polysilicion. However, the thickness of the photoresist will cast a shadow over the implant area when the angle of implant is high and the body opening is small. Others have used a P-well or a combined P-body and P-well instead of the conventional P-body only LDMOS. However, that solution increases the dimension because the P-well is not self-aligned to the gate polysilicon.

SUMMARY

An asymmetric hetero-doping high-voltage MOSFET (AH²MOS) power semiconductor device is fabricated on a monocrystalline semiconductor substrate, typically, silicon. The device has an epitaxial layer with spaced apart field oxide (FOX) regions to provide surface electrical isolation from other devices such as low voltage logic and linear devices. The AH²MOS device is formed between the FOX regions. The AH²MOS has tap, tub, source, gate, buffer, drift and drain regions. The source and tub regions are self-aligned with one side of the gate and the buffer and drift regions are self-aligned with the other side of the gate. The tub and the source regions share one mask layer and are implanted with hetero-dopants. The tub is implanted with dopants of a first polarity. Inside the tub region is a source region having dopants of a second polarity, opposite to the first polarity. A tap partially or fully overlaps to the source. The gate has an insulation layer of silicon dioxide and the gate is conductive polysilicon. The buffer and the drift regions also share one mask layer and are implanted with hetero-dopants. The buffer region is implanted with dopants of the first polarity. The drift region is inside the buffer region and is implanted with dopants of the second polarity. Inside the drift region is a highly doped drain.

As a result, the power devices have two hetero-doped architectures that are asymmetric.

In an AH²MOS embodiment, the n+ source and the p-tub regions are hetero-doped and self-aligned to one side of the gate polysilicon. The source region is a relatively shallow n+ region inside a relatively deep p-tub. Oxide spacers on the sides of the gate act as masks and protect the shallow n+ source region and prevent subsequent p-type implants from encroaching into the channel. The oxide spacers act as tiny masks and cover the part of the n+ source closest to the channel and thereby protect the n+ source beneath the oxide spacer. As a result, the n+ source is shielded from implants for the p+ tap, even if p+ tap fully overlaps to the n+ source. The p+ tap region now can be made to extend under a very high percentage of the n+ source region and close to the device channel. The p-tub resistance underneath the effective n+ source area (n+ source underneath oxide spacer) is very small, due to a deep and very narrow p-tub built beneath the effective n+ area. The source-side hetero-doped architecture limits turn on of the parasitic transistor formed by the n+ source (emitter), p-tub (base), and n− drift region (collector). Therefore, the AH²MOS can operate in a very large safe operation area (SOA).

The drift and the buffer regions are also hetero-doped and self-aligned with the other side of the gate polysilicon. The n− drift region is inside the p− buffer region. The drift region has a high concentration of dopants compared to the epitaxial layer and that reduces on resistance. In addition, the concentration of dopants in the buffer region is also much greater than the concentration of dopants in the p-type epitaxial layer region. This feature limits how far the depletion region extends into the p-type epitaxial layer and increases the distance that the depletion region extends into the drift region. The buffer layer helps generate a wider depletion region in the drift region. Therefore, by optimizing the drift doping concentration and junction depth, and the buffer doping concentration and junction depth, most of the drift region can be depleted and that keeps the breakdown voltage high.

The channel length of AH$^2$MOS is defined by gate poly length and can be shrunk to submicron or deep-submicron for low channel resistance. The threshold voltage and the punch-through voltage of the AH$^2$MOS are controlled by the hetero-doped implants, and, in particular by the two key control factors, the p-tub implant and the p-buffer implant. Such control makes the process more flexible. The hetero-doped source/p-tub and the hetero-doped n-drift/p-buffer are asymmetric to the gate polysilicon with different lengths in lateral direction and with different junction depths in vertical direction.

DETAILED DESCRIPTION

Figure 1:
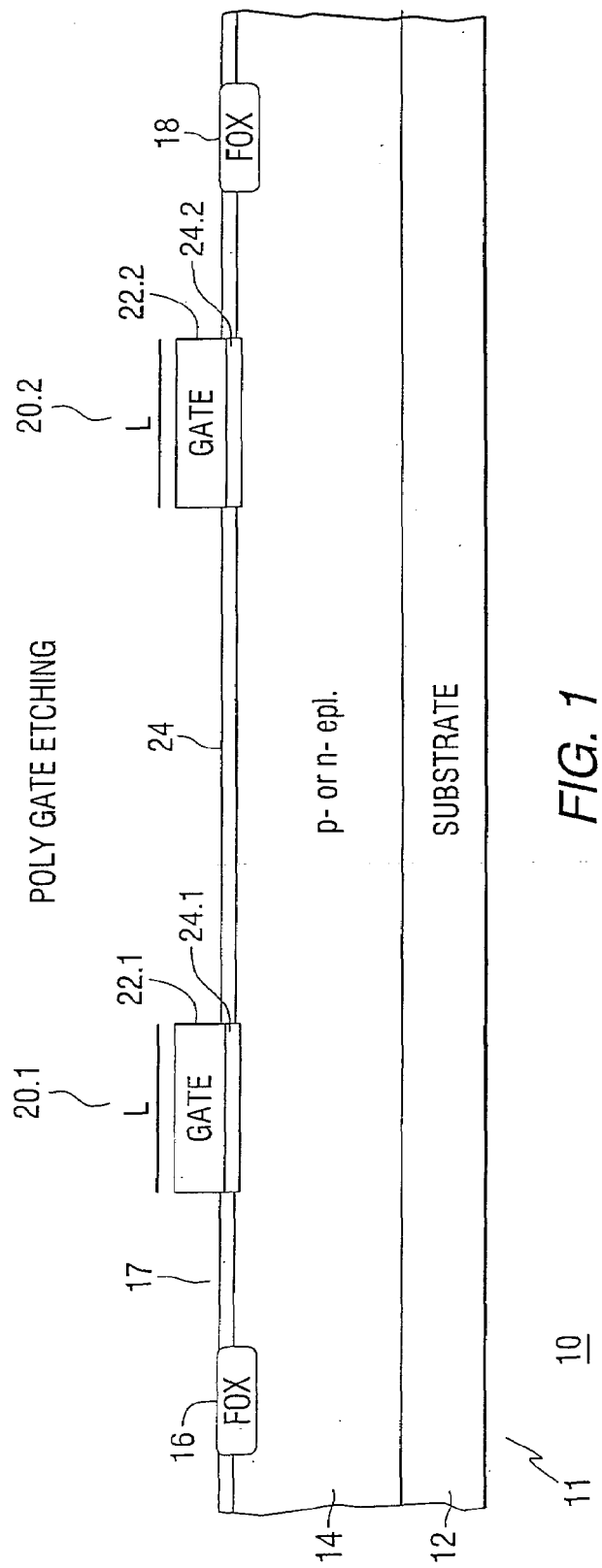
FIGS. 1–4 show sequential process steps for forming the AH$^2$MOS device.

The process for forming an AH$^2$MOS semiconductor device having two poly gate stripes is shown in FIGS. 1–4. The process begins with selecting a semiconductor monocrystalline substrate 12 of silicon. However, other semiconductor materials including germanium or compound semiconductor material such as silicon carbide or gallium arsenide may be used. The substrate 12 is placed in an epitaxial reactor where a thin, epitaxial layer 14 of semiconductor monocrystalline material is grown or deposited on the substrate 12. The power and logic devices are formed in layer 14. Layer 14 has an exposed surface 17. Where silicon is used as the semiconductor material, sequential layers of silicon dioxide and silicon nitride are deposited and patterned to expose field oxide (FOX) regions 16, 18. The substrate is further reacted in an oxidizing atmosphere (typically steam) to grow multiple FOX regions 16, 18. Two such regions are shown in FIG. 1, but those skilled in the art understand that the AH$^2$MOS device has multiple FOX regions and corresponding multiple stripes of p+ tap, source, gate, drift and drain regions, where the regions are formed between the FOX regions 16, 18. In addition, the FOX regions 16, 18 also serve as lateral isolation regions to separate the AH$^2$MOS device from other low voltage devices.

After the FOX regions 16, 18 are formed, the silicon dioxide and silicon nitride layers are stripped and the areas between the FOX regions 16, 18 are prepared to receive the asymmetric hetero-doped implants that will form the p+ tap, source, gate, drift and drain regions. A gate oxide layer 24 is deposited or formed by oxidizing the exposed surface of the epitaxial layer 14. A layer of polysilicon 22 is deposited on the gate oxide layer. The polysilicon layer 22 may be deposited as a highly doped layer or may be doped later on. In either case, the polysilicon is doped sufficiently to render it conductive. The polysilicon layer 22 is then masked and etched to remove unwanted portions and thereby form the insulated gate structures 20.1 and 20.2. The gates have insulating layers 24.1, 24.2 and conductive layers 22.1, 22.2, respectively.

Figure 2:
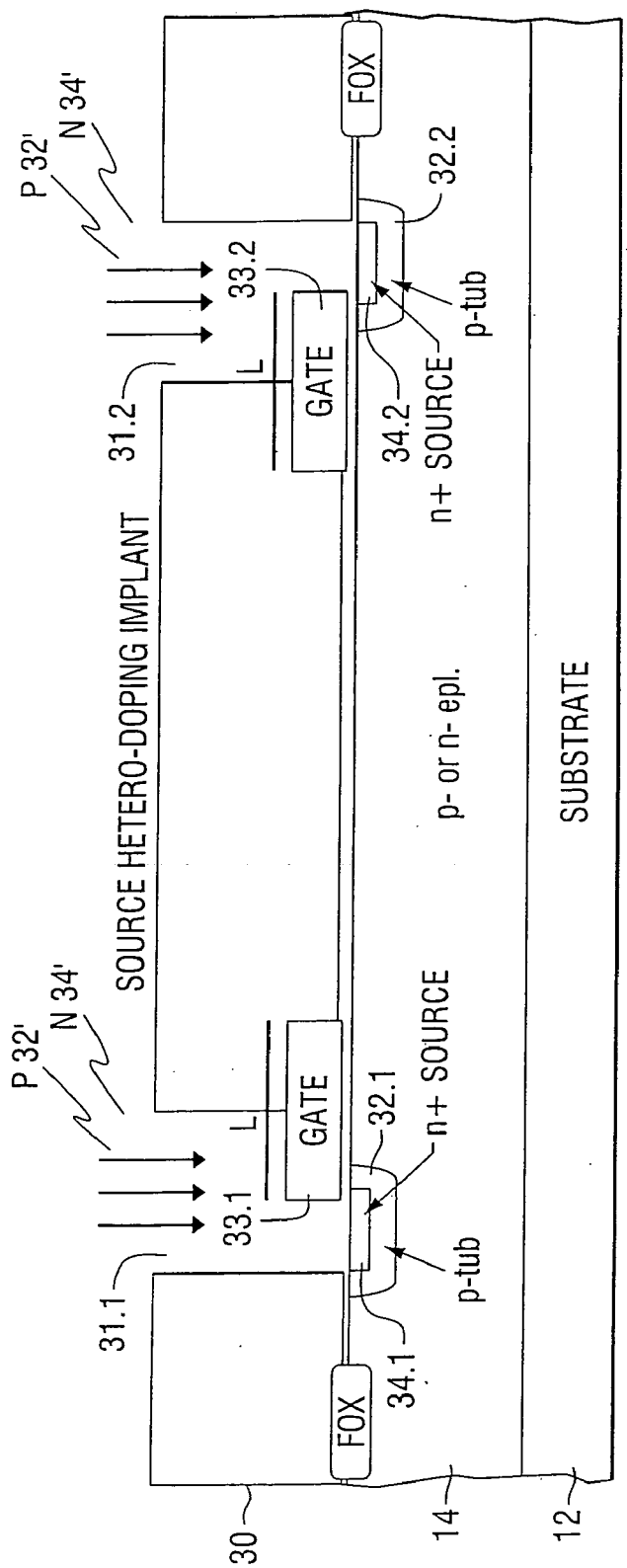

Turning to FIG. 2, a layer of photoresist 30 is deposited over the substrate 12. A mask, not shown, is used to pattern the photoresist. The pattern is designed to provide openings over portions of the gates 20.1, 20.2 and portions of the epitaxial layer 14 located between the gates and the FOX regions 16, 18. A suitable etch process, either a wet or dry etch, removes the unwanted portions of the photoresist layer to establish the openings 31.1, 31.2. The patterned photoresist forms a mask on the substrate. The substrate is inserted into an ion implantation apparatus where two dopants of opposite polarity are implanted into the exposed portions of the gate and the epitaxial layer. One dopant 32' is a P-type dopant such as boron that is implanted with 60 keV to provide about 2E13 atoms/cm$^2$ dose. The other dopant is an N-type dopant 34', such as arsenic, that is implanted with 30 keV to provide a dose of 3E15 atoms/cm$^2$. The P-type implant forms tubs 32.1, 32.2 in the epitaxial layer 14. The N-type dopant forms N+ source regions 34.1, 34.2 in the tubs, respectively. The hetero-doped implants form source and tub regions that are self-aligned with one side of the gates. The regions of the tub beneath the gate 33.1, 33.2 will control the device threshold voltage and the device punch-through voltage. The device channel length is defined by gate polysilicon length. The p- epitaxial layer beneath the gate polysilicon has a very low doping concentration, typically around 5e14 atoms/cm3. Without the p-type tub and p-type buffer, the AH$^2$MOS would easily punch-through from drain to source and could not support a high voltage from drain to source. Also the device would have high leakage if there was no p-tub or p-buffer.

Figure 3:
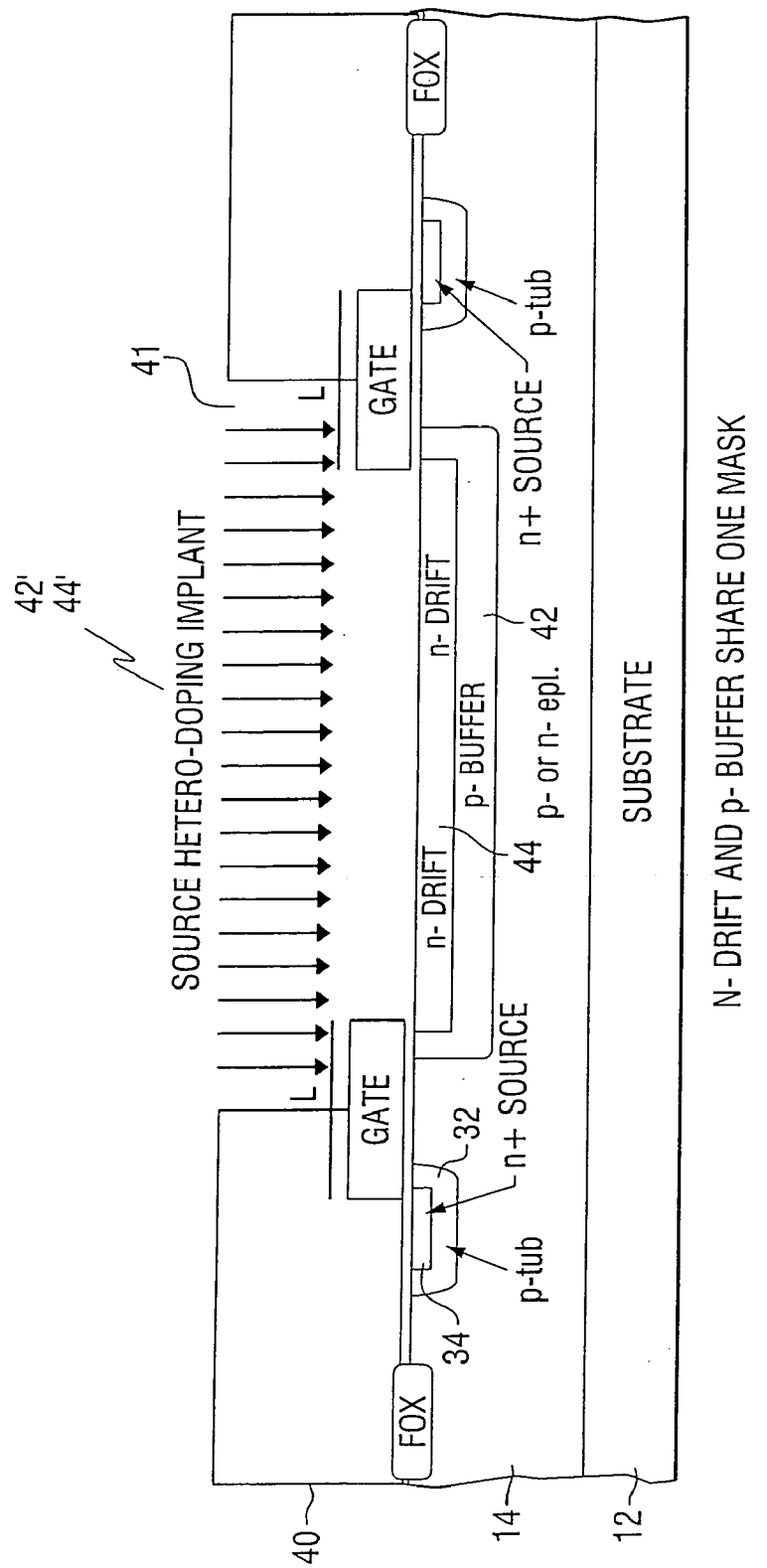

As shown in FIG. 3, the photoresist mask 30 is removed and a second photoresist mask 40 is formed over the surface 17. Mask 40 is patterned to have openings 41 that expose portions of the gate and region of the surface 17 between the FOX regions 16, 18. The substrate is again inserted into an ion implantation apparatus and undergoes a second hetero-doping operation. The implant will form drift and buffer regions that are self-aligned with the gates. The P-type dopant ions 42' are boron and they are implanted with about 100 keV energy and a dose of about 1–3 E12 atoms/cm$^2$. N-type phosphorus ions 44' are implanted to form a drift region 44. The phosphorus ions are implanted with 100 keV energy and a dose of about 3–5 E12 atoms/cm$^2$. The phosphorous ions 44' penetrate the surface 17 deeper than the corresponding arsenic ions 34 and the P-buffer 42' implant energy is higher and the dose is lower than that of the P-tub region 32' implant. As such, the heterodoped regions have different doping profiles and asymmetrical shaped regions. In other words, the P-tubs 32 differ in concentration and shape from the P-buffer regions 42 and the N-sources 34 differ in concentration and shape from the N-drift regions 44. The ion implants create some damage to the crystal lattice structure of the epitaxial layer 14. That damage is cured by one or more rapid thermal annealing operations that are short enough to prevent significant diffusion of the ions from the regions of implant.

Figure 4:
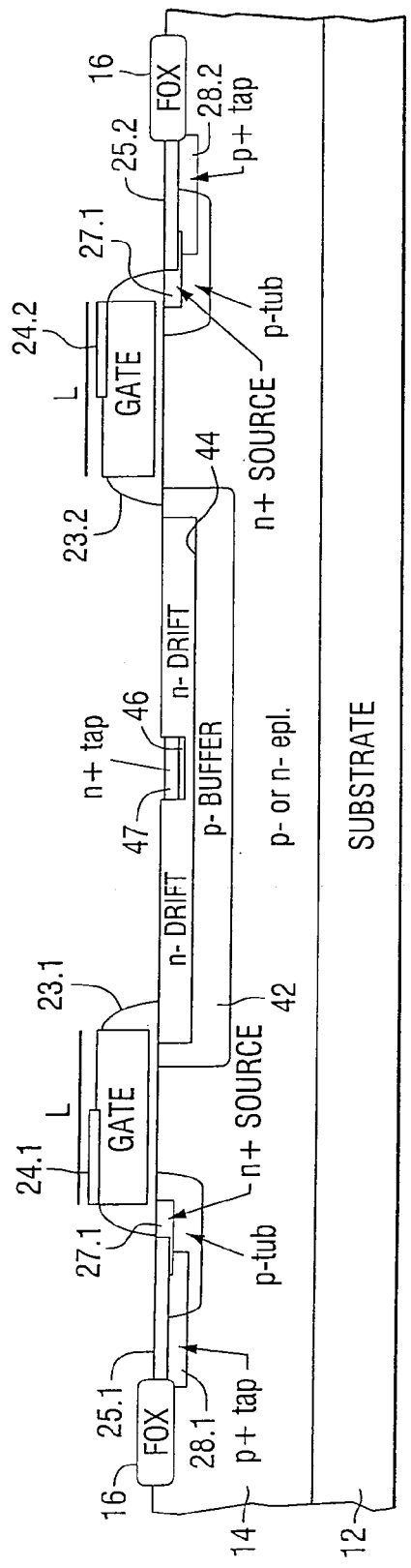
Figure 5C:
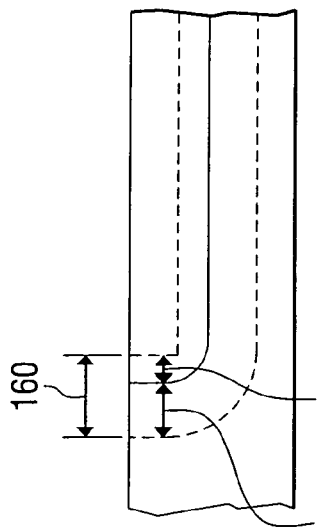
FIGS. 5a–5d compare the depletion region of a prior art LDMOS device to an AH$^2$MOS device.
Figure 5D:
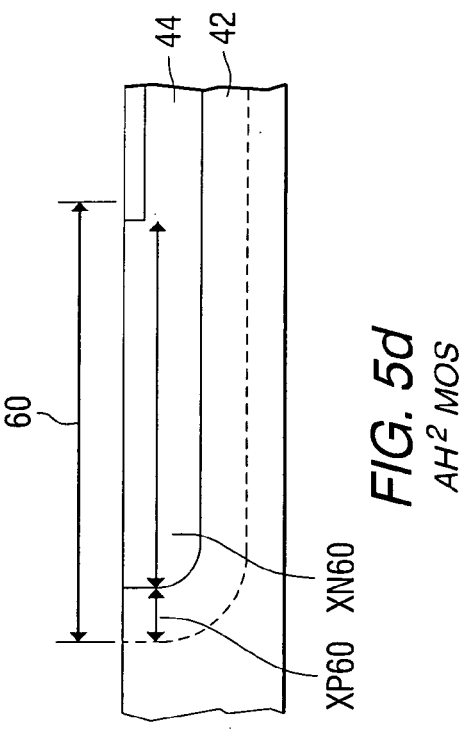
Figure 5A:
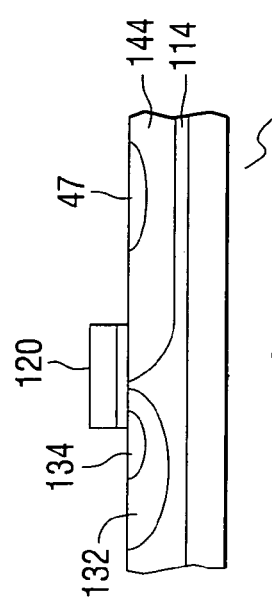
Figure 5B:
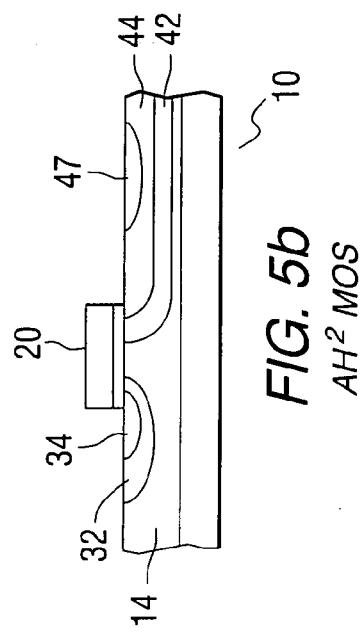

Further features of the process are shown in FIG. 4. The mask 40 is stripped and the substrate is subject to further steps that include forming sidewall oxide spacers 23 on the sides of the gates 20. The additional features shown in FIG. 4 are may be formed using conventional steps of low voltage logic devices. Such devices may be formed on the same substrate 12. Such logic devices, including CMOS logic devices, will require steps to form N+ source/drain contacts and P+ source/drain contacts. Those process steps are used to complete the manufacture of the AH$^2$MOS device. In particular, the AH$^2$MOS regions 11 are suitably masked and implanted via conventional steps to provide P+ tap regions 28 and N+tap regions 46. Likewise, the P+ and N+ and portions 24 of the gates are silicided to increase their conductivity in other steps also known to those skilled in the art. It is very important for AH$^2$MOS that the silicided layer can be used to connect to the sidewall of the effective, very shallow n+ source beneath the oxide spacer, even with p+ tap fully self-aligned to the oxide spacer.

In conventional LDMOS processes, it is common practice to implant boron as the LDMOS P-body and use the NMOS/PMOS source/drain implants as LDMOS N+ source/P+ tap. That process occurs after the sidewall spacer oxide is in place on the sides of the polysilicon gate. The process includes putting a low doping concentration (n-type lightly doped drain, NLDD) underneath an oxide spacer on the sides of the polysilicon gate. Because the P+ tap is not self-aligned to N+ source, the size of the P+ tap region is a key variable. On the one hand, if the P+ tap region overlaps too little of the N+ source or if there is a large distance between the P+ tap and the N+ source, the P-body resistance to lateral avalanche current flow beneath the source region will increase. The voltage potential in the increased resistance will allow parasitic transistor, formed by the N+ source (emitter), P-body (base), and N− drift region (collector), turned-on easily. That is a well-known failure mechanism and is frequently encountered during unclamped inductive switching, other highly stressful static discharges with high dv/dt and commutating conditions with high di/dt. One the other hand, if the P+ tap region overlaps too much of the N+ source, the P+ tap regions will compensate the source doping, increase source resistance and increase contact resistance due to high doping compensation in the contact region.

In contrast to such conventional processes, the AH$^2$MOS source formation in this invention is made before the oxide spacer process. That means that the very shallow N+ source in this invention is aligned to the gate polysilicon, and can be built underneath oxide spacer (compared to N+ source aligned to oxide spacer in the prior arts for LDMOS). The oxide spacer acts as a tiny mask to protect N+ source from compensation by the P+ tap, even if the P+ tap is fully aligned to oxide spacer. When the P+ tap is fully aligned to the oxide spacer, the P-tub resistance underneath the effective N+ source area is reduced and the resulting structure inhibits turn on of the the parasitic transistor formed by the N+ source (emitter), P-tub (base), and N− drift region (collector).

A common approach for improving an LDMOS's safe operating area (SOA) is to use of a deep and heavily doped P− body region that reduces P-body resistance underneath N+ source. However, that high performance LDMOS is difficult to integrate with conventional CMOS processes because the deep and heavily doped P-body is not compatible with advanced technology that limits they duration of high temperature exposure of the substrate. Others have made the LDMOS first or early in the process and then used a low voltage process to form CMOS, NMOS and PMOS devices. When the process forms the P-body diffusion before processing low voltage devices, it means that the P-body is formed before gate polysilicon etching and even the before field oxide process. However, that trade off limits LDMOS P-body to self-aligned gate polysilicon. In other words, the channel length is defined by the P-body underneath gate polysilicon in LDMOS. If the P-body is self-align to the gate polysilicon, one can create short channel length for LDMOS, and thereby reduce channel resistance for good device performance. Therefore, high voltage devices have to have very large gate polysilicon length, this will induces large channel resistance of the device and also increase the device size, although using advanced process tools.

The invention keeps the heavily doped P+ tap the same size as the P+ PMOS source/drain, but with a hetero-doped very shallow N+ source and a relatively deep P-tub. Both the source and tub are self-aligned to one side of the gate. This approach achieves the same results as that of the prior art does. However, this approach has the advantage of distributing the parasitic BJT, and it is most effective when the P+ tap region extends under a high percentage of the N+ source region and close to the device channel. That feature enables the devices made with the process of the invention to reduce the effective N+ source length which reduces the P-tub resistance beneath the effective source region. The effective N+ source region in the preferred embodiment is defined by the oxide spacer area and, therefore, the P-tub resistance underneath will be minimized for device large safe operation area.

The channel length of AH$^2$MOS is defined by gate polysilicon length in contrast to the LDMOS in which channel length is defined by P-body and source thermal double diffusions. Therefore, no extra thermal diffusion processes are needed for AH$^2$MOS channel formation. The channel length of the AH$^2$MOS is scaleable and can be shrunk to submicron or deep-submicron lengths that provide short channel length and therefore low channel resistance. The threshold voltage and the punch-through voltages of the AH$^2$MOS are controlled by the hetero-doping implants, in particular, by the p-tub and p-buffer implants. This gives the process and device designs of the invention more flexibility. In conventional devices it is common to use of a deep and heavily doped p− body region to reduce P-body resistance underneath n+sources, to thereby increase a LDMOS's safe operating area (SOA). However, if the p-body doping concentration is too high, the device threshold voltage will increase, inducing large channel resistance. If the p-body doping concentration is too low, the device punch-through voltage will be too low.

In contrast, the AH$^2$MOS provides several new ways to trade-off SOA, threshold voltage, punch-through voltage, drain to source avalanche breakdown voltage and device on-state resistance. The low P-tub resistance and the relatively tiny effective N+ source reduces threshold voltage and gives a large SOA even though the P-tub doping concentration is not low. The P-buffer prevent punch-through from the N-drift region to the N+ source and thereby increases the AH$^2$MOS punch-through voltage. The P-tub lateral doping profile will help the P-buffer to easily pinch-off the depletion area near the sidewall of the N-drift region and reduce high electric fields in the polysilicon edge area. This raises the avalanche breakdown threshold at the sidewall of the N-drift junction near the gate polysilicon edge, as we will discuss below.

In an ideal device, the on resistance is minimal and the breakdown voltage is high. But prior art LDMOS devices require a trade off between lowering on resistance and raising breakdown voltage. As one improves, the other gets worse because both are controlled by the doping of the drift region. With reference to FIG. 5 there is shown a conventional LDMOS region 111. On resistance is calculated when the device is in its forward operating mode. The more lightly doped drift region 144 is responsible for most of the on resistance. Those skilled in the art know that on resistance may is reduced by increasing the doping of the drift region. However, increased doping in the drift region will reduces the junction depletion region and thereby low the junction avalanche breakdown voltage. It is determined by the width of the depletion region which is inversely proportional to the concentration in doping at the junction of the substrate and the drift region. If the drift region is highly doped, the on resistance is low but the depletion region is small and the avalanche breakdown voltage is reduced. If the drift region is lightly doped, the depletion region is wider, breakdown voltage increases but the one resistance is higher due to the lower doping.

The depletion region occurs at the junction of the P-epitaxial region and the N drift region when a positive bias is applied to the N-drift region. The positive voltage potential in the N region push holes out the junction from the P region and attract electrons across the junction from the N region. A distance on both sides of the junction becomes depleted of charge carriers and this is known as the depletion region. There is now an electric field extending across the junction from the N to the P region and no current flows because there are no charge carriers in the junction. The width of the depletion region depends upon the concentration of dopants on each side of the junction. If the doping concentration is high, the depletion region will be close to the junction. If the concentration is low, the depletion region will be farther from the junction. In a conventional LDMOS device the depletion region in the drift region is relatively short when the drift region has a relatively high doping for reduce on resistance.

With reference to FIGS. 5a–5d, the width 160 of the depletion region in a conventional LDMOS devices is determined by the difference in doping concentrations between the epitaxial layer 114 and the drift region 144. The width 160 has two components, XP160 and XN160. The magnitude of each component is inversely proportional to the doping concentration in the respective P and N regions 114 and 144. Since the P– epitaxial doping concentration is much lower than the N-drift doping concentration, the depletion region in N– drift is relatively small. In the invention, the doping of the buffer layer 42 is much greater than the doping of the P– epitaxial layer. Recall that the P-buffer 42 had a dose of 1–3 E 12 atoms/cm$^2$ with doping concentration around 8E 16 atoms/cm$^3$ whereas the P-epitaxial region had a doping near 5E14 atoms/cm$^3$. The P-buffer region has a concentration more than 100 times the P-epitaxial region. As such, at a similar voltage bias of the junction with a similar depletion charges in the depletion region 60, the width 60 of the depletion region for the invention is XP60 plus XN60 and the contribution of XP60 (invention) is much smaller than the contribution of XP160 (prior art) and the contribution of XN60 (invention) is greater than the contribution of XN160 (prior art). By suitable trading-off between the doping and the junction depth of the N-drift to the doping of the P-buffer, the contribution of XN 60 (invention) can be much greater than the contribution of XN160 (prior art) due to depletion in the N-drift pitched-off to the surface of the junction and the depletion region occupied most of the N-drift. The width of the depletion region of the invention is controlled by the total doping and by the different concentrations of the N and P implants 44, 42. In prior art devices the breakdown voltage is controlled by the depletion width of the higher doping part (N-drift). Because the contribution of XN60 (invention) has been greatly increased, the new device in the invention will have much high breakdown voltage. In the other words, at a similar or higher breakdown voltage compared to the prior art, the N-drift doping concentration can be increased for a low on-state resistance of the device. In the invention, the N-drift region 44 had a dose of 3–5 E12 atoms/cm$^2$ with doping concentration around 1E18 atoms/cm$^3$. In conventional LDMOS, the highest electric field happens near the gate polysilicon edge in the N-drift when its doping concentration too high. Due to the short channel length of the AH$^2$MOS, the P-tub lateral doping profile can partially overlap P-buffer near the sidewall of the N-drift and can help P-buffer to easily pitch-off the depletion area near the sidewall of the N-drift (this is also the gate polysilicon edge area in the N-drift) and reduce the local electric field to prevent low avalanche breakdown from happening in the sidewall of the N-drift junction.

There are three kinds of architectures for AH$^2$MOS used in power IC technologies, low-side, high-side and isolated architectures. Embodiments of the invention in those architectures are shown, respectively, in FIGS. 6, 7 and 8. Following the process described above, a low-side AH$^2$MOS 60 is formed by shorting the N+ source to ground via a conductor 61. The shorting is generally made using a patterned metal layer or patterned layer of heavily doped polysilicon.

Figure 6:
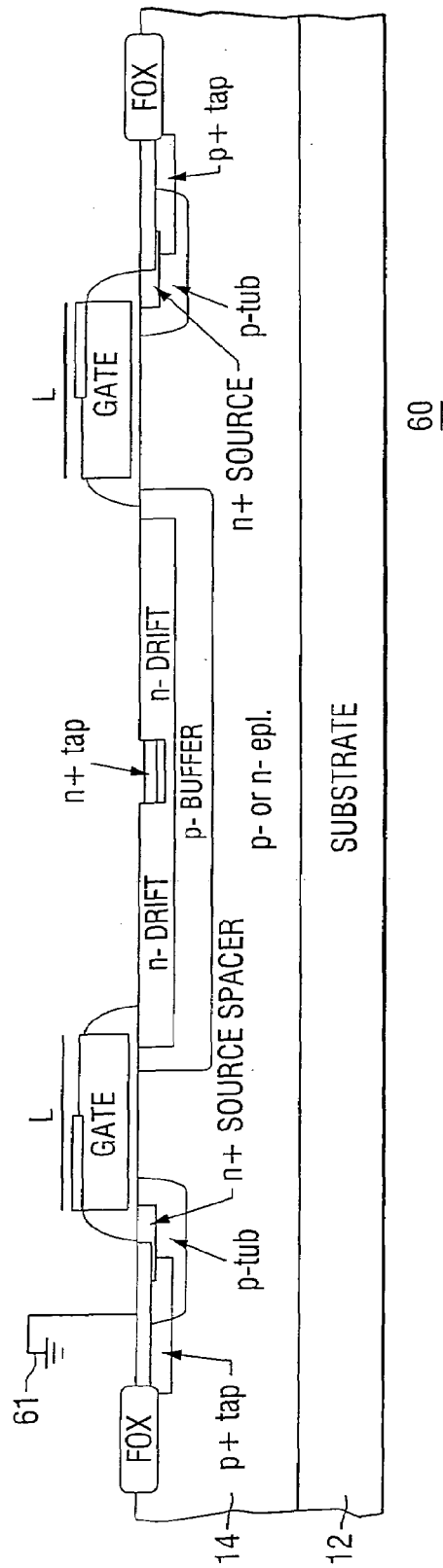
FIG. 6 shows a low side AH$^2$MOS device.
Figure 7:
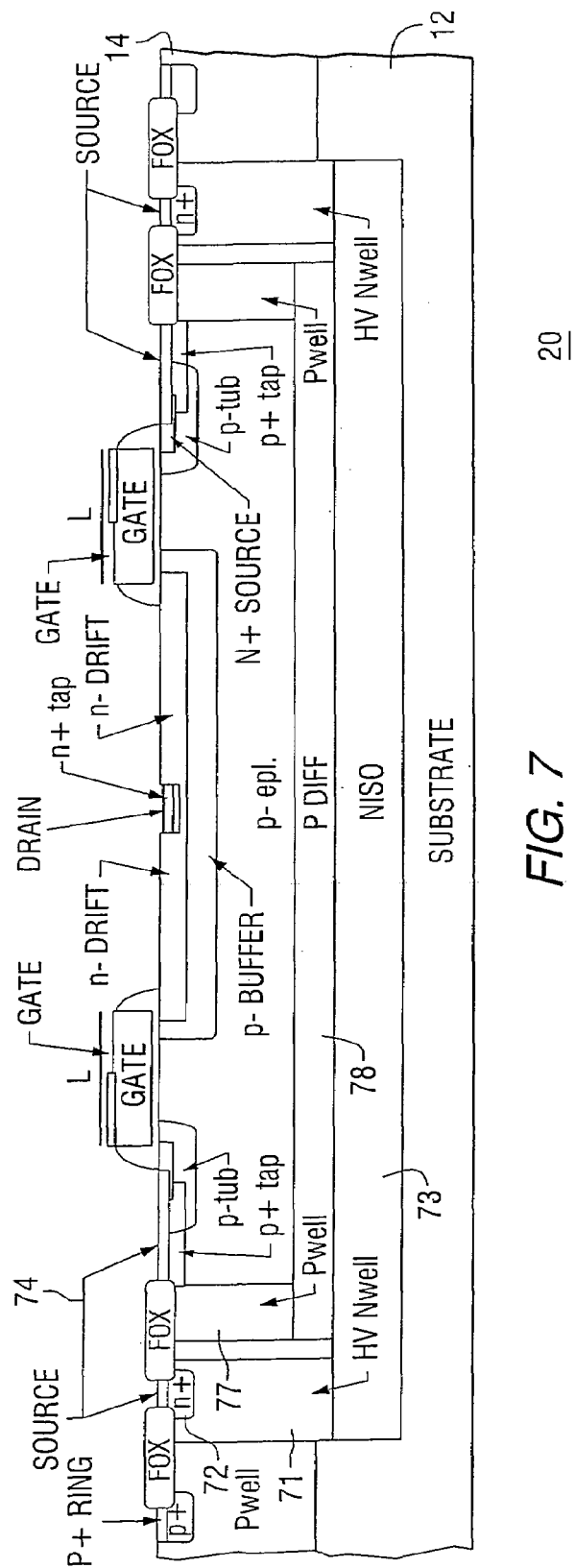
FIG. 7 shows a high side AH$^2$MOS device.

It is known to have one LDMOS for the low side and another LDMOS for the high-side in a power driver. As shown in FIG. 6, a low-side architecture for AH$^2$MOS has its source terminal shorted to the substrate. FIG. 7 shows a high-side architecture for AH$^2$MOS. Note the additional diffusions and wells needed to isolate the high voltages from other devices on the substrate. In addition, the source is connected to the HV well.

A High-side AH$^2$MOS 70 (FIG. 7) and an isolated AH$^2$MOS 80 (FIG. 8) are built with similar elements in and on the substrate. For the sake of economy, only the structure of the High-side device 70 will be described in detail. As will be explained below, during manufacture the high-side device is formed with an internal PN junction separating the drift, buffer, and channel regions from the substrate. The N terminal of the PN structure is connected to the source. During manufacture the process forms an N-type tub that comprises N-type isolation (NISO) layer 73 and N-type ring 71. The NISO layer 73 is formed on or in the substrate 12. The high voltage ring diffusion ring 71 extends from the surface to the NISO layer 73. A heavily doped N+ contact 72 is formed at the surface of the high voltage ring 71. The high voltage ring 71 is shorted to the source 73 by a conductor 74. The N-type tub 71/73 is isolated from gate, channel, N-drift and P-buffer layers by a P-type ring that comprises P-well 77 and P-type layer (PDIFF) 78. The P-type ring 77/78 has a doping concentration of 4e15~3e18 atoms/cm$^3$ which is much higher than the P-epi. doping concentration (~5e14 atoms/cm$^3$). As such, the P-type ring can support a high punch-through voltage between the N-type tub 71/73 and the AH$^2$MOS n-type source/drain. The source of AH$^2$MOS is tied to the high voltage N-type tub 71/73 for high side application and the required high source to substrate breakdown voltage now is determined by high voltage N-well 71 to substrate breakdown, which is very high and in the range of 16V and 120V for the device shown in FIG. 7.

Figure 8:
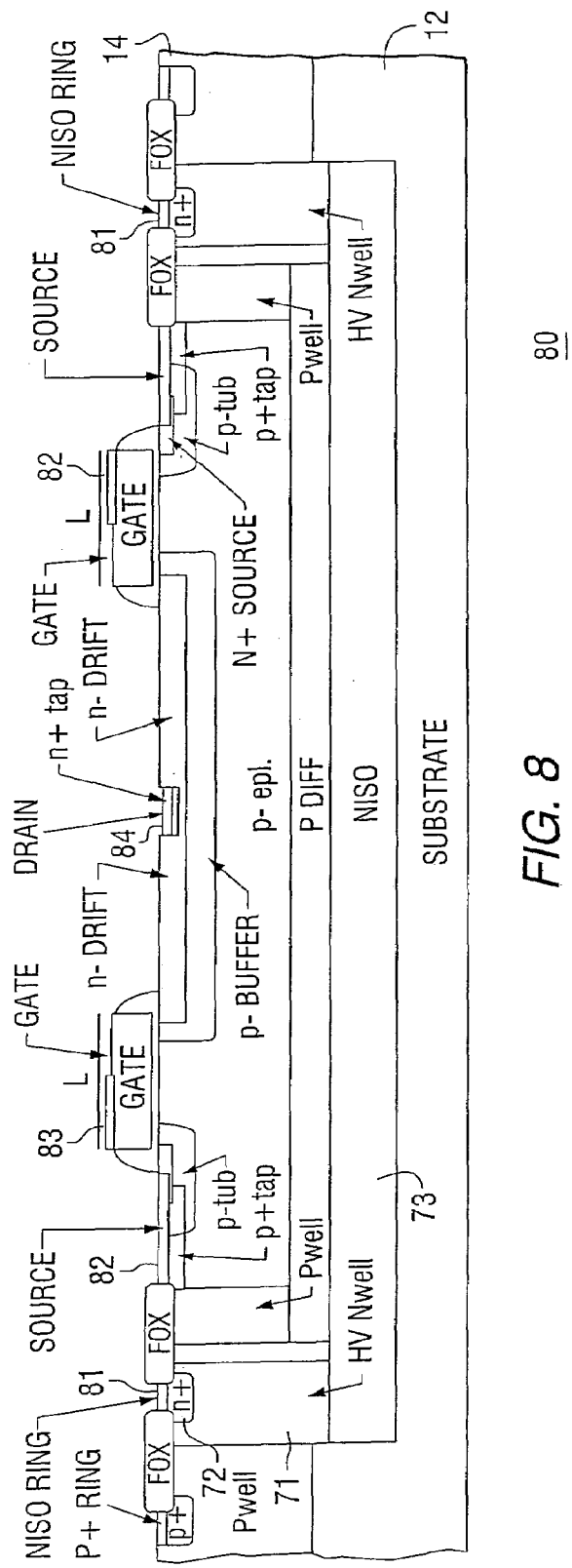
FIG. 8 shows an isolated AH$^2$MOS device.

Turning to FIG. 8, the isolated AH$^2$MOS has are four terminals, drain, source, gate and NISO terminals. The NISO terminal is connected to the N-portion of the PN isolation structure described above. By further coupling the NISO terminal to the high voltage source, the device is isolated. The high voltage n-type tub 71/73 is always tied to local high voltage 81 designed to prevent the turn on of a parasitic bipolar transistor. That parasitic transistor is a PNP transistor that includes P-tub 77/P-epi 14/PDIFF 78 (emitter), NISO layer 73 (base) and P-substrate 12 (collector). The drain and the source of AH$^2$MOS can be switched to negative voltage, such as a minimum of −70V in the invention. The high punch-through voltage between the n-type tub 71/73 to source/drain of the AH²MOS prevents turn on of a lateral parasitic NPN transistor formed by the N+ source/drain (emitter), p-substrate (base) and a nearby n-type well or n+ source /drain (collector not shown in FIG. 8).

The embodiments shown above uncouple the on resistance from the breakdown voltage. Now both parameters may be separately fashioned into a device without the conventional adverse trade off between them. With the embodiments, one may have a low on resistance and a high breakdown voltage.

Another advantage of the embodiments is they may be used with conventional CMOS processes for making devices that have power and logic devices on the same substrate without adversely affecting the performance of either type device.

In addition, the retrograde doping due to the P-tub and the effective tiny N+ source size prevent formation of a parasitic N/P/N transistor by the N-drift, P-tub and N+ source.

The P-tub and the P-buffer lateral doping profiles control the device threshold voltage and device punch-through voltage and no extra process steps are needed to control either threshold or punch-through voltage.

An advantage of the embodiments is their AH²MOS regions 11 may be formed in either a P-type or N-type epitaxial layer. Either polarity is acceptable because the on resistance (channel resistance plus N-drift resistance) and the width of depletion region do not mainly depend, on the doping of the epitaxial layer 14 but instead depend upon P-tub and P-buffer and the difference in doping concentration between the P-buffer 42 and the N-drift 44.

Another feature is that the AH²MOS embodiment shown above may have very small source and P+ tab areas of total 0.5 um based on a 0.35 um technology because a normal, small implant angle (7°)is permitted.

The hetero-doped tub, source, buffer and drift regions are asymmetrical in concentration and shape. The following table shows the acceptable ranges of dopant concentration and depth.

|  | Concentration | Depth | Dopant |
| --- | --- | --- | --- |
| Tub | 5E16~1E18 atoms/cm³ | 0.2~0.9 um | Boron |
| Source | 1E19~1E21 atoms/cm³ | 0.03~0.12 um | Arsenic |
| Buffer | 4E15~4E17 atoms/cm³ | 0.2~0.8 um | Boron |
| Drift | 5E16~5E18 atoms/cm³ | 0.1~0.4 um | Phosphorus |

In summary, an asymmetric hetero-doped high-voltage MOSFET power semiconductor device 10 may be made alone or on the same substrate as low voltage logic and linear devices. The tub 34 and the source 32 regions are implanted self-aligned with one side of the gates 20 and the buffer 44 and the drift 42 regions are implanted self-aligned with the other side of the gates 20. The tub 34 and the source 32 regions share one mask layer and are implanted with hetero-dopants. The buffer 44 and the drift 42 regions also share one mask layer and are implanted with hetero-dopants. As a result, the power devices have two hetero-doped architectures that are asymmetric. The regions are not subjected to high temperature long duration thermal diffusion, therefore, compatible with low voltage, deep submicron logic process. The low on resistance, high breakdown voltage and large safe operating area of AH²MOS are controlled by the doping profiles in the asymmetric hetero-doped architecture. AH²MOS with some embodiments, such as low-side, high-side and isolated architectures, can be used for power integrated circuits and for power semiconductor discrete devices.

The invention claimed is:

1. A process for forming a heterodoped semiconductor device comprising the steps of:
   providing a semiconductor substrate;
   forming one or more insulated gates over the substrate;
   forming a first mask that exposes expose portions of the surface of the substrate adjacent one side of the gates;
   implanting the exposed portions of the surface through the first mask with dopants of opposite polarities to form tub and source regions of opposite polarity dopants adjacent the one side of the gate;
   forming a second mask that exposes portions of the surface of the substrate adjacent the other side of the gates; and
   implanting the exposed portions of the surface through the second mask with dopants of opposite polarities to form buffer and drift regions of opposite polarity dopants adjacent the other side of the gate.

2. The process of claim 1 comprising the further steps of forming sidewall spacers on the sides of the gates and over the source regions and implanting the substrate with a heavily doped tap implant of the same polarity dopants as in the tub implant to form a tap region overlapping the source region.

3. The process of claim 1 wherein the doping concentration of the buffer region is substantially greater than the doping concentration in portion of the substrate bordering the buffer region.

4. The process of claim 1 wherein the dopants implanted adjacent the one side of the gates are asymmetric with the dopants implanted adjacent the other side of the gates.

5. The process of claim 4 wherein the concentration of the tub region dopants is greater than the concentration of the buffer region dopants and the concentration of the source region dopants is greater than the concentration of the drift region dopants.

6. The process of claim 4 wherein the tub and buffer implants have the same polarity and the length of the tub implant is less than the length of the buffer implant.

7. The process of claim 4 wherein the source and the drift implants have the same polarity and the length of the source implant is less than the length of the drift implant.

8. The process of claim 4 wherein the tub and buffer implants are of the same polarity and the depth of the tub implant is less than the depth of the buffer implant.

9. The process of claim 4 wherein the source and the drift implants are of the same polarity and the depth of the source implant is less than the depth of the drift implant.

10. A process for forming a heterodoped semiconductor device comprising the steps of:
    providing a semiconductor substrate;
    forming an epitaxial layer over the substrate, said layer having a surface;
    forming a plurality of pairs of insulated gates over the epitaxial layer;
    isolating the pairs of gates from adjacent pairs;
    masking the surface to expose portions of each gate and portions of regions adjacent each exposed gate portion;
    implanting the exposed portions of the surface and the gates with dopants of first and second, opposite polarities to form source and well regions in the substrate;

stripping the mask and masking the implanted portions of the surface and the implanted portions of the gates to expose the rest of the gates and a portion of the surface between the gates;

implanting the exposed portions of the gates and the exposed portion of the surface between the gates with dopants of first and second, opposite polarities to form drift and buffer regions in the substrate between the gates;

further masking the surface to expose a portion of the surface between the gates;

implanting the exposed portion of the surface between the gates with a dopant of a first polarity to form a drain N+ tap;

further masking the surface to expose a portion of the surface between the gates; and implanting the exposed portion of the surface between the gates with a dopant of a second polarity to form a p+ tap.

11. The process of claim 10 wherein the same mask is used to expose and implant the drift and buffer regions.

12. The process of claim 10 wherein the same mask is used to expose the source and tub regions.

13. The process of claim 10 wherein the source regions are surrounded by their respective tub regions and the drift regions are surrounded by their respective buffer regions.

14. The process of claim 10 further comprising steps for forming CMOS devices on the same substrate as the heterodoped device and further comprising the step of simultaneously forming highly doped tap implants of first and second polarity dopants in the heterodoped device during formation of heavily doped source and drain contacts for the CMOS devices.

15. The process of claim 10 comprising the further step of forming an isolation ring comprising a junction structure for isolating the drift and buffer regions from the substrate.

16. The process of claim 10 wherein the concentration of dopant in the drift region is greater than the concentration of dopants in the buffer region.

17. The process of claim 16 wherein the concentration of dopants in the buffer region is substantially greater than the doping concentration in the p-epitaxial region.

18. The process of claim 10 wherein the first polarity dopant is N-type and the second polarity dopant is P-type.

19. The process of claim 18 wherein the P-type dopant is boron and the N-type dopants are arsenic and phosphorous.

20. The process of claim 18 wherein the dopants for the tub have a concentration in a range of 5E16-1E18 atoms/cm3 and have a depth in a range between 0.2 and 0.9 μm.

21. The process of claim 18 wherein the dopants for the source have a concentration in a range of 1E19-1E21 atoms/cm3 and have a depth in a range between 0.03–0.12 μm.

22. The process of claim 18 wherein the dopants for the buffer regions have a concentration in a range of 4E15-4E17 atoms/cm3 and a depth in a range between 0.2–0.8 μm.

23. The process of claim 18 wherein the dopants for the drift regions have a concentration in a range between 5E16-5E18 atoms/cm3 and a depth in a range between –0.1–0.4 μm.

* * * * *